(12) United States Patent
Roth

(10) Patent No.: US 9,109,779 B2
(45) Date of Patent: Aug. 18, 2015

(54) DEFOCUSED OPTIC FOR MULTI-CHIP LED

(75) Inventor: Eric Roth, Tyngsboro, MA (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 13/642,010

(22) PCT Filed: Apr. 22, 2011

(86) PCT No.: PCT/IB2011/051776
§ 371 (c)(1),
(2), (4) Date: Nov. 12, 2012

(87) PCT Pub. No.: WO2011/135506
PCT Pub. Date: Nov. 3, 2011

(65) Prior Publication Data
US 2013/0200407 A1    Aug. 8, 2013

Related U.S. Application Data

(60) Provisional application No. 61/328,757, filed on Apr. 28, 2010.

(51) Int. Cl.
| | |
|---|---|
| *H01L 29/205* | (2006.01) |
| *F21V 7/09* | (2006.01) |
| *F21V 7/00* | (2006.01) |
| *G02B 19/00* | (2006.01) |
| *H01L 33/60* | (2010.01) |
| *F21Y 101/02* | (2006.01) |
| *F21Y 113/00* | (2006.01) |

(52) U.S. Cl.
CPC .............. *F21V 7/09* (2013.01); *F21V 7/0016* (2013.01); *F21V 7/0033* (2013.01); *F21V 7/0066* (2013.01); *G02B 19/0028* (2013.01); *G02B 19/0066* (2013.01); *H01L 33/60* (2013.01); *F21Y 2101/02* (2013.01); *F21Y 2113/007* (2013.01)

(58) Field of Classification Search
USPC ......... 257/91, 95, 98, 100; 362/346, 347, 350
See application file for complete search history.

(56) References Cited

U.S. PATENT DOCUMENTS

| | | | |
|---|---|---|---|
| 4,617,619 | A | 10/1986 | Gehly |
| 6,016,038 | A | 1/2000 | Mueller et al. |
| 6,139,166 | A | 10/2000 | Marshall et al. |

(Continued)

FOREIGN PATENT DOCUMENTS

| | | |
|---|---|---|
| DE | 0707614 C | 6/1941 |
| DE | 202005002787 U1 | 7/2005 |

(Continued)

*Primary Examiner* — Marvin Payen
(74) *Attorney, Agent, or Firm* — Yuliya Mathis

(57) ABSTRACT

A defocused optic (110, 210) for mixing of light output from a multichip LED (101, 201). The defocused optic (110, 210) includes an outer reflector having a concave inner surface (122, 26, 222, 226) with a varied profile. The outer reflector surrounds an interior reflector (140, 240) having a convex surface (142, 242). The convex surface (142, 242) of the interior reflector (140, 240) is positioned to generally face a multichip LED (101, 201) and may optionally have a varied profile. Appropriate selection of the design parameters of the profiles of the concave inner surface (122, 126, 222, 226), the profile(s) of the convex surface (142, 242), and the rotational angular range over which said profiles are present enables appropriate mixing of the light output from a given multi-chip LED (101, 201).

20 Claims, 4 Drawing Sheets

(56) References Cited

U.S. PATENT DOCUMENTS

| | | |
|---|---|---|
| 6,211,626 B1 | 4/2001 | Lys et al. |
| 6,513,962 B1 | 2/2003 | Mayshack et al. |
| 6,604,839 B2 | 8/2003 | Coleman et al. |
| 2003/0147237 A1 | 8/2003 | Halasz |
| 2007/0070643 A1 | 3/2007 | Lampen et al. |
| 2007/0257272 A1 | 11/2007 | Hutchins |
| 2009/0121238 A1 | 5/2009 | Peck |
| 2009/0135606 A1 | 5/2009 | Young |
| 2009/0219716 A1 | 9/2009 | Weaver et al. |
| 2010/0039805 A1 | 2/2010 | Romelt |
| 2010/0039822 A1* | 2/2010 | Bailey ............ 362/296.1 |

FOREIGN PATENT DOCUMENTS

| | | |
|---|---|---|
| EP | 1182395 A2 | 2/2002 |
| FR | 2639683 | 6/1990 |
| JP | 200227009 A | 9/2002 |
| JP | 2006222413 A | 8/2006 |
| WO | 2005078338 A1 | 8/2005 |
| WO | 2008089324 A2 | 7/2008 |

* cited by examiner

DEFOCUSED OPTIC FOR MULTI-CHIP LED

TECHNICAL FIELD

The present invention is directed generally to an optic for a LED. More particularly, various inventive methods and apparatus disclosed herein relate to a defocused optic for mixing light output from a multi-chip LED.

BACKGROUND

Digital lighting technologies, i.e. illumination based on semiconductor light sources, such as light-emitting diodes (LEDs), offer a viable alternative to traditional fluorescent, HID, and incandescent lamps. Functional advantages and benefits of LEDs include high energy conversion and optical efficiency, durability, lower operating costs, and many others. Recent advances in LED technology have provided efficient and robust full-spectrum lighting sources that enable a variety of lighting effects in many applications. Some of the fixtures embodying these sources feature a lighting module, including one or more LEDs capable of producing different colors, e.g. red, green, and blue, as well as a processor for independently controlling the output of the LEDs in order to generate a variety of colors and color-changing lighting effects, for example, as discussed in detail in U.S. Pat. Nos. 6,016,038 and 6,211,626, incorporated herein by reference.

Multi-chip LEDs (LED packages containing multiple LED chips) provide relatively high levels of light output. However, efficient mixing of the light output from the various LED chips of a multi-chip LED is necessary in order to minimize undesirable visible artifacts, such as color rings/color banding that may be visible around the edge of the beam pattern outputted by the multi-chip LED. Current methodologies employed to mix the light output from the various LED chips of the multi-chip LED involve texturing and/or an elongated compound parabolic concentrator (CPC). Texturing involves the addition of texture on an optic surface in order to scatter light passing through the textured optic surface. Texturing may allow for satisfactory color-mixing in the central area of a beam pattern, but the edges of the beam pattern still often show color rings/color banding. Moreover, the addition of texture to an optical surface typically increases the beam angle of the light output to an unsatisfactory degree and texturing is very hard to maintain and control in production. The use of a CPC may provide satisfactory mixing of the light output from a multi-chip LED, but may also increase the beam angle of the light output to an unsatisfactory degree.

Thus, there is a need in the art to satisfactorily mix the light output from a multi-chip LED package while maintaining a desirable beam angle and efficient package size.

SUMMARY

The present disclosure is directed to inventive methods and apparatus for satisfactorily mixing light output from a multi-chip LED. For example, a defocused optic may be provided having an outer reflector and an interior reflector that cooperate to provide mixing of light output. The outer reflector surrounds the interior reflector and has a concave inner surface that surrounds a central axis of the defocused optic. The inner surface has a profile that changes at one or more rotational angular positions with respect to the central axis of the defocused optic. In other words, the profile of the inner surface may have certain design parameters over a certain angular range around the central axis in order to effectuate desired reflective parameters over that angular range. For example, the inner surface may include a first profile that spans approximately forty-five degrees around the central axis and a second profile distinct from the first profile that neighbors the first profile and spans approximately forty-five degrees around the central axis.

The interior reflector of the defocused optic includes a convex surface that faces a multi-chip LED when the defocused optic is used in combination with a multi-chip LED. The convex surface redirects a majority of light output from the multi-chip LED and impingent thereon outwardly toward the inner surface of the outer reflector. Optionally, the profile of the convex surface may change at one or more angular positions with respect to the central axis of the defocused optic. In other words, the profile of the convex surface may have certain design parameters over a certain angular range around the central axis in order to effectuate desired reflective parameters over that range. The changes in the profile of the convex surface may optionally occur at similar angular positions as changes that occur in the profile of the inner surface.

Through appropriate selection of the design parameters of the profiles of the inner surface, the profile(s) of the convex surface, and the angular range over which said profiles are present, appropriate mixing of the light output from a multi-chip LED may be achieved while maintaining a satisfactory beam angle and efficient package size.

Generally, in one aspect, the invention relates to a defocused optic for mixing light output from a multi-chip LED that includes an outer reflector surrounding an interior reflector and a central axis. The outer reflector includes a concave inner surface provided about the central axis. The concave inner surface redirects a majority of the light output impingent thereon toward an illumination area. The concave inner surface defines a first concave surface profile at a first angular position relative to the central axis and a second concave surface profile at a second angular position relative to the central axis. The first concave surface profile is distinct from the second concave surface profile. The interior reflector has a convex surface facing the multi-chip LED that redirects a majority of the light output impingent thereon toward the outer reflector. The convex surface defines a first convex profile at the first angular position and a second convex profile at the second angular position. The first convex profile is distinct from the second convex profile.

In some embodiments, the outer reflector includes a concave second inner surface provided about the central axis. The second inner surface is positioned more distal the multi-chip LED than the inner surface. In some versions of these embodiments the second inner surface defines a third concave surface profile at the first angular position and a fourth concave surface profile at the second angular position. The third concave surface profile is distinct from the first concave surface profile and the fourth concave surface profile is distinct from the second concave surface profile.

In some embodiments, the concave inner surface defines a third concave surface profile at a third angular position relative to the central axis. The third concave surface profile is distinct from the first concave surface profile and distinct from the second concave surface profile. In some versions of these embodiments the concave inner surface also has the second concave surface profile at a third angular position relative to the central axis and the second angular position is interposed between the first angular position and the third angular position. In some versions of these embodiments the third angular position is offset approximately one-hundred and eighty degrees from the first angular position.

Generally, in another aspect, the invention relates to a LED-based lighting unit that includes at least one multi-chip LED and a defocused optic. The multi-chip LED includes a plurality of LED chips and each of the LED chips emit a LED light output having a main LED light output axis. The defocused optic includes an outer reflector, an interior reflector, and a central axis. The outer reflector surrounds the interior reflector and surrounds the multi-chip LED. The outer reflector includes a concave inner surface provided about the central axis that redirects a majority of the light output impingent thereon toward an illumination area. The concave inner surface defines a first concave surface profile at a first angular position relative to the central axis and a second concave surface profile at a second angular position relative to the central axis. The first concave surface profile is distinct from the second concave surface profile. The interior reflector includes a convex surface facing the multi-chip LED that redirects a majority of the light output impingent thereon toward the outer reflector. The convex surface intersects each light output axis and defines a first convex profile at the first angular position and a second convex profile at the second angular position. The first convex profile is distinct from the second convex profile.

In some embodiments at least eighty percent of the light output that is redirected toward the illumination area is redirected within a fifteen degree beam angle.

In some embodiments the concave inner surface has a first focal point at the first angular position that is located between a base of the concave inner surface at the first angular position and the LED light output axis most proximal the base of the concave inner surface at the first angular position. In some versions of these embodiments the concave inner surface has a second focal point at the second angular position that is located between the base of the concave inner surface at the second angular position and the LED light output axis most proximal the base of the concave inner surface at the second angular position.

In some embodiments the outer reflector includes a concave second inner surface provided about the central axis that is positioned more distal the multi-chip LED than the inner surface. In some versions of these embodiments the second concave inner surface defines a third concave surface profile at the first angular position and a fourth concave surface profile at the second angular position. The third concave surface profile is distinct from the first concave surface profile and the fourth concave surface profile is distinct from the second concave surface profile.

In some embodiments the concave inner surface defines a third concave surface profile at a third angular position relative to the central axis. The third concave surface profile is distinct from the first concave surface profile and the second concave surface profile.

Generally, in another aspect, a defocused optic for mixing light output from a multi-chip LED comprises a bi-level outer reflector surrounding an interior reflector and a central axis. The outer reflector includes a lower concave inner surface provided about the central axis and an upper concave inner surface provided about the central axis more radially than the lower concave inner surface. The lower concave inner surface and the upper concave inner surface each redirect a majority of the light output impingent thereon toward an illumination area. The lower concave inner surface includes a plurality of lower concave inner surface sections each having a lower focal point that is distinct from at least one neighboring of the lower concave inner surface sections. The upper concave inner surface includes a plurality of upper concave inner surface sections each having an upper focal point that is distinct from at least one neighboring of the upper concave inner surface sections and distinct from at least one neighboring of the lower concave inner surface sections. The interior reflector includes a convex surface facing the multi-chip LED. The convex surface redirects a majority of the light output impingent thereon outwardly toward the outer reflector.

In some embodiments the convex surface comprises a plurality of convex surface sections each having a convex focal point that is distinct from at least one neighboring of the convex surface sections.

In some embodiments, each lower concave inner surface section extends at least fifteen degrees about the central axis.

In some embodiments, each lower concave inner surface section is substantially angularly aligned with a corresponding upper concave inner surface section.

In some embodiments, the upper focal point of each upper section is located more distal thereto than the central axis.

In some embodiments, the lower focal point of each lower section is located more proximal thereto than the central axis.

In some embodiments, at least four upper concave inner surface sections are provided and at least four lower concave inner surface sections are provided.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured and/or controlled to generate radiation having various bandwidths (e.g., full widths at half maximum, or FWHM) for a given spectrum (e.g., narrow bandwidth, broad bandwidth), and a variety of dominant wavelengths within a given general color categorization.

For example, one implementation of an LED configured to generate essentially white light (e.g., a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectra of radiation (e.g., that may or may not be individually controllable). Also, an LED may be associated with a phosphor that is considered as an integral part of the LED (e.g., some types of white LEDs). In general, the term LED may refer to packaged LEDs, non-packaged LEDs, surface mount LEDs, chip-on-board LEDs, T-package mount LEDs, radial package LEDs, power package LEDs, LEDs including some type of encasement and/or optical element (e.g., a diffusing lens), etc.

The term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

The term "lighting fixture" or "luminaire" is used herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources. A "multi-channel" lighting unit refers to an LED-based or non LED-based lighting unit that includes at least two light sources configured to respectively generate different spectrums of radiation, wherein each different source spectrum may be referred to as a "channel" of the multi-channel lighting unit.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Multi-chip LEDs provide relatively high levels of light output. Efficient mixing of the light output from the various LED chips of a multi-chip LED is necessary in order to minimize the presence of color rings/color banding that may be visible around the edge of the beam pattern outputted by the multi-chip LED. Current methodologies employed to mix the light output from the various LED chips of the multi-chip LED have one or more drawbacks. For example, current methodologies may cause the edges of the beam pattern to still show substantial color rings and/or may increase the beam angle of the light output to an unsatisfactory degree for a given application. Thus, Applicant recognized and appreciated that it would be beneficial to provide a defocused optic for mixing of light output while achieving a desired beam angle. The defocused optic provided herein includes an outer reflector having a concave inner surface with a varied profile and an interior reflector having a convex surface with an optionally varied profile. Through appropriate selection of the design parameters of the profiles of the inner surface, the profile(s) of the convex surface, and the rotational angular range over which said profiles are present, appropriate mixing of the light output from a given multi-chip LED package may be achieved while maintaining a satisfactory beam angle and efficient package size.

More generally, Applicant has recognized and appreciated that it would be beneficial to have a defocused optic that satisfactorily mixes the light output from a multi-chip LED package.

In the following detailed description, for purposes of explanation and not limitation, representative embodiments disclosing specific details are set forth in order to provide a thorough understanding of the claimed invention. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the claimed invention.

Figure 1:
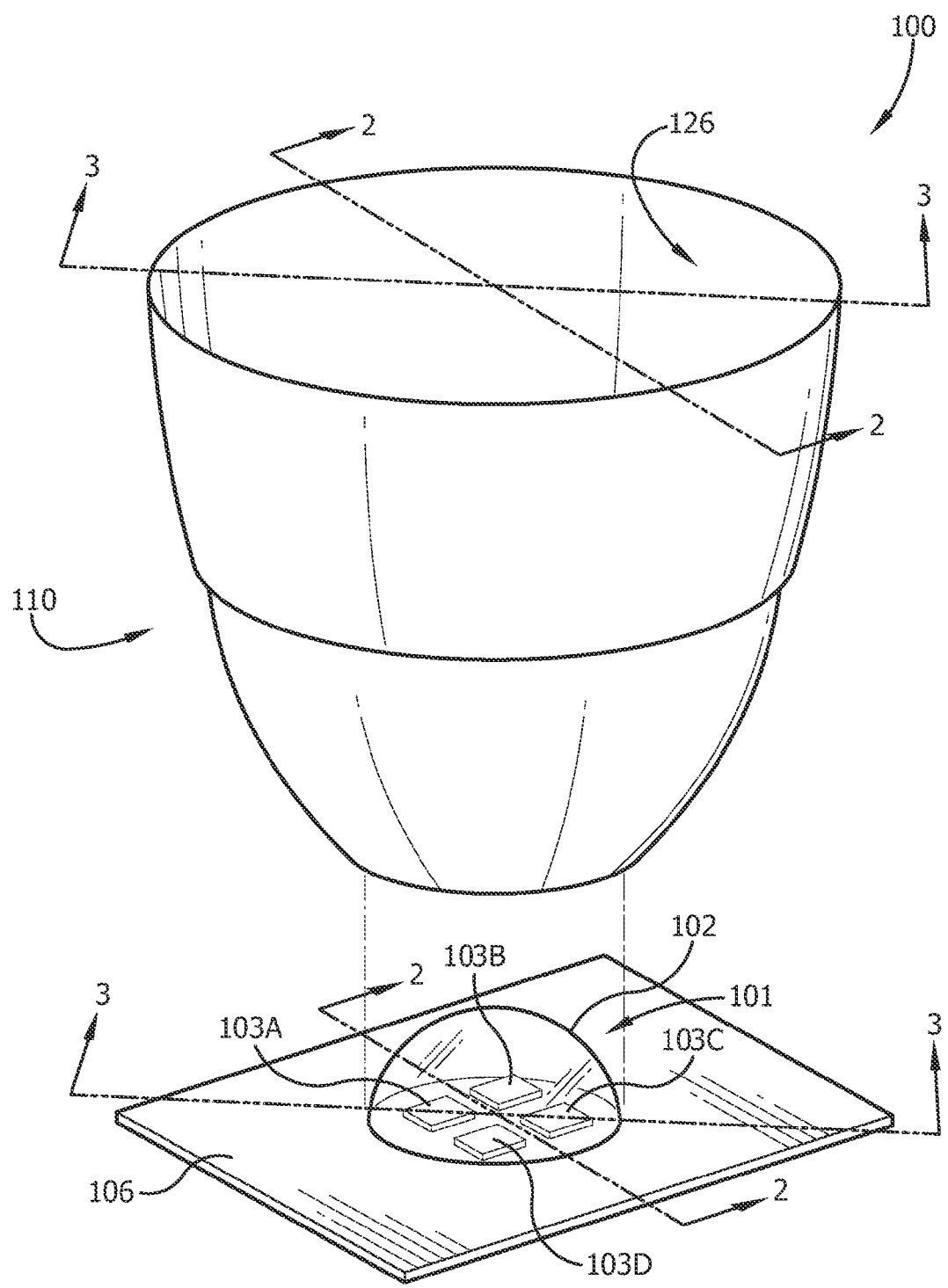
FIG. 1 illustrates a perspective view of a first embodiment of a LED-based lighting unit having a first embodiment of defocused optic; the defocused optic is shown exploded away from a multi-chip LED of the LED-based lighting unit.

Referring to FIG. 1, in one embodiment, a LED-based lighting unit 100 includes a first embodiment of a defocused optic 110. The defocused optic 110 is shown exploded away from a multi-chip LED 101 of the LED-based lighting unit 100. The multi-chip LED 101 includes four individual LED chips 103A-D surrounded by an LED dome 102. Each of the LED chips 103A-D may emit light having a spectrum that is unique from at least one other of the LED chips 103A-D. The LED chips 103A-D are mounted on a mounting base 106. In some embodiments, the multi-chip LED 101 may be a XLamp MC-E LED light source, available from Cree, Inc. (Durham, N.C.). However, one of ordinary skill in the art having had the benefit of the present disclosure will recognize that other multi-chip LEDs may be utilized in combination with the defocused optic 110 described herein. For example, the defocused optic 110 may be configured for use with multichip LEDs having more or less than four individual LED chips, having individual LED chips arranged in a different relationship with respect to one another, having alternative mounting configurations, and/or having alternative LED dome configurations. One of ordinary skill in the art having had the benefit of the present disclosure will recognize and appreciate the various design parameters to be taken into account in designing a defocused optic based on the teachings hereof that produces satisfactory mixing of light output from the individual chips of a multi-chip LED while maintaining a satisfactory beam angle.

The defocused optic 110 may be affixed in position about multichip LED 101 and may optionally include alignment structure to aide in affixing defocused optic 110 at a desired orientation with respect to multichip LED 101. In some embodiments an adhesive may be utilized at the interface between the base of the defocused optic 110 and the mounting base 106 in order to affix the defocused optic 110 to the mounting base 106. Alternative or additional couplings between the defocused optic 110 and the mounting base 106, the multichip LED 101, and/or other structure may also be utilized. In some embodiments the defocused optic 110 may be attached using mechanical affixation methods, including, but not limited to prongs, fasteners, depending structure and the like that interface with corresponding structure on the mounting base 106. This interchangeably includes structure upwardly extending from mounting base 106 that corresponds with structure on defocused optic 110.

Figure 2:
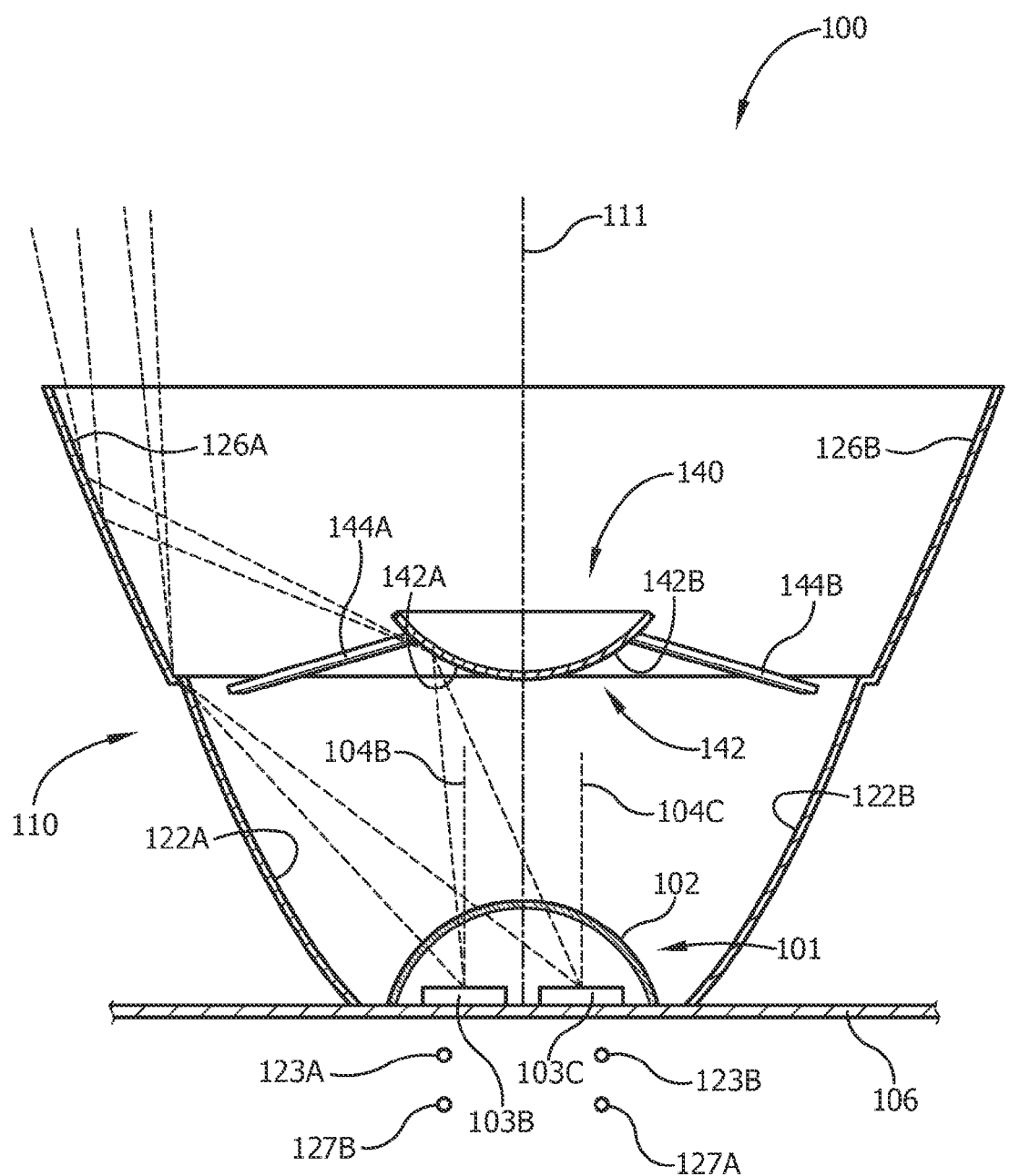
FIG. 2 illustrates a section view of the LED-based lighting unit of FIG. 1 taken along the section line 2-2 of FIG. 1.
Figure 3:
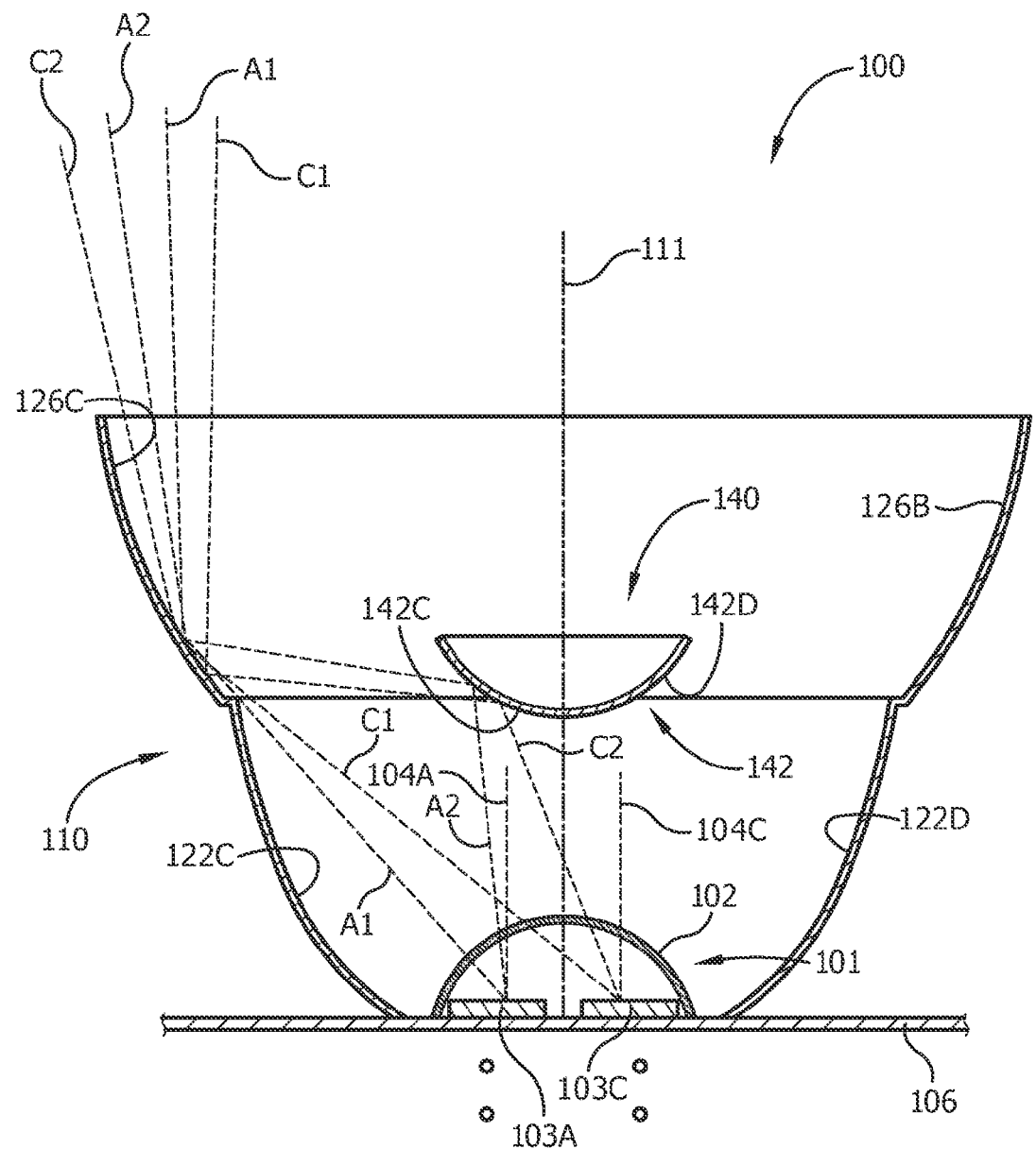
FIG. 3 illustrates a section view of the LED-based lighting unit of FIG. 1 taken along the section line 3-3 of FIG. 1.

Portions of a concave upper inner surface 126 of an outer reflector of the defocused optic 110 are visible in FIG. 1 and it can generally be seen in FIG. 1 that the profile of the upper inner surface 126 is varied relative to the rotational angle about a central axis 111 of the defocused optic 110. The central axis 111 of the defocused optic 110 is an axis that generally lies central to all of the inner concave reflective surfaces described herein. Optionally, the central axis 111 of the defocused optic 110 may also generally lie central to the convex surface of the interior reflector 140 described herein. Reference is now made to FIG. 2 and FIG. 3 to describe several aspects of the defocused optic 110 in additional detail. FIG. 2 illustrates a section view of the LED-based lighting unit of FIG. 1 taken along the section line 2-2 of FIG. 1 and FIG. 3 illustrates a section view taken along the section line 3-3 of FIG. 1. The section line 3-3 and the section line 2-2 are coplanar and both extend through the central axis 111. The section line 3-3 is offset approximately forty-five degrees from section line 2-2 relative to the rotational angle about central axis 111.

Referring particularly to FIG. 2, the upper inner surface 126 of the outer reflector defines a first upper inner surface profile 126A at a first angular position relative to the central axis 111 and a second inner surface profile 126B at a second angular position relative to the central axis 111. The first angular position and the second angular position are offset one-hundred and eighty degrees from one another. The first upper inner surface profile 126A and the second upper inner surface profile 126B share a common curvature and are non-distinct from one another. However, the first upper inner surface profile 126A and the second upper inner surface profile 126B have distinct focal points. The first upper inner surface profile 126A has a focal point 127A that is more distal the upper inner surface profile 126A than the central axis 111 and more distal than a LED light output axis 104C of LED chip 103C. Each LED light output axis 104A-D is an axis emanating from the center of the light emitting portion of a corresponding LED chip 103A-D and is oriented in a direction away from and substantially perpendicular to the mounting base 106. The second upper inner surface profile 126B has a focal point 127B that is more distal the upper inner surface profile 126A than the central axis 111 and more distal the LED light output axis 104B of LED chip 103B.

The outer reflector of the defocused optic 110 also includes a lower concave inner surface 122 that is coupled to the concave upper inner surface 126 and is located more proximal to the multichip LED 101 than the concave upper inner surface 126. The lower concave inner surface 122 defines a first lower inner surface profile 122A at the first angular position relative to the central axis 111 and a second lower inner surface profile 122B at the second angular position relative to the central axis 111. The first lower inner surface profile 122A and the second lower inner surface profile 122B share a common curvature and are non-distinct from one another. However, the first lower inner surface profile 122B and the second lower inner surface profile 122B have distinct focal points. The first and second lower inner surface profiles 122A and 122B have a greater curvature than upper inner surface profiles 126A and 126B. The first lower inner surface profile 122A has a focal point 123A that is more proximal the lower inner surface profile 122A than the central axis 111 and more proximal than the LED light output axis 104B of LED chip 103B. The second lower inner surface profile 122B has a focal point 123B that is more proximal the lower inner surface profile 122B than the central axis 111 and more proximal than the LED light output axis 104C of LED chip 103C.

Still referring to FIG. 2, an interior reflector 140 is surrounded by the upper inner surface 126 and the lower inner surface 122 of the outer reflector. The interior reflector 140 has a convex surface 142 facing the multi-chip LED 101. The multichip LED 101 intersects the central axis 104A-D of each LED chip 103A-D and intersects the central axis 111. The convex surface 142 defines a first convex profile 142A at the first angular position relative to the central axis 111 and a second convex profile 142B at the second angular position. The first convex profile 142A and the second convex profile 142B share a common curvature and are non-distinct from one another. The first convex profile 142A and the second convex profile 142B also share a common focal point 143A that is located along the central axis 111. The interior reflector 140 is supported by support struts 144A and 144B that extend between the convex surface 142 and the lower inner surface 122 of the outer reflector. The interior reflector 140 may be otherwise supported in alternative embodiments. For example, one or more support struts may extend from other portions of defocused optic 110 and/or other support structure may extend from defocused optic 110, multichip LED 101, and/or mounting base 106.

Ray traces of exemplary light rays B1 and B2 that emanate from LED chip 103B and light rays C1 and C2 that emanate from LED chip 103C are also shown in FIG. 2. Light rays B1 and C1 are directly impingent on upper inner surface profile 126A at approximately the same point on upper inner surface profile 126A. Upper inner surface profile 126A reflects light rays B1 and C1 such that light ray B1 is reflected more exteriorly than light ray C1. Light rays B2 and C2 are directly impingent of convex surface profile 142A at approximately the same point and are reflected outwardly toward upper inner surface profile 126A. The light rays B2 and C2 are then reflected by upper inner surface profile 126A such that light ray C2 is reflected more exteriorly than light ray B2. In effect, the convex surface profile 142A acts to reverse the image coming from the LED chips 103B and 103C, thereby causing a light ray emanating from LED chip 103C and directly incident on a point on convex surface profile 142A to be emanated from the defocused optic 110 more exteriorly than a light ray emanating from LED chip 103C and incident on that same point.

Referring particularly to FIG. 3, it is illustrated that the upper inner surface 126 defines a fourth upper inner surface profile 126C at a third angular position relative to the central axis 111 and a fourth upper inner surface profile 126D at a fourth angular position relative to the central axis 111. The third angular position and the fourth angular position are offset one-hundred and eighty degrees from one another. The third and fourth angular positions are offset approximately forty-five degrees from respective of the first and second angular positions in a first rotational direction. The third upper inner surface profile 126C and the fourth upper inner surface profile 126D share a common curvature and are non-distinct from one another. However, the third upper inner surface profile 126C and the fourth upper inner surface profile 126D are distinct from first upper inner surface profile 126A and the second upper inner surface profile 126D. In particular, the third upper inner surface profile 126C and the fourth upper inner surface profile 126D have a greater curvature than the first upper inner surface profile 126A and the second upper inner surface profile 126D.

Also, the third upper inner surface profile 126C and the fourth upper inner surface profile 126D have distinct focal points from one another and distinct from the first and second upper inner surface profiles 126A and 126B. The third upper inner surface profile 126C has a focal point 127C that is more distal than the third upper inner surface profile 126C than the central axis 111 and more distal than the LED light output axis 104C. The fourth upper inner surface profile 126D has a focal point 127D that is more distal the third upper inner surface profile 126D than the central axis 111 and more distal than the LED light output axis 104A.

The lower inner surface 122 defines a third lower inner surface profile 122C at the third angular position relative to the central axis 111 and a fourth lower inner surface profile 122D at the fourth angular position relative to the central axis 111. The third lower inner surface profile 122C and the fourth lower inner surface profile 122D share a common curvature and are non-distinct from one another. However, the third lower inner surface profile 122C and the fourth lower inner surface profile 122D are distinct from the first lower inner surface profile 122A and the second lower inner surface profile 122B. In particular, the third lower inner surface profile 122D and the fourth lower inner surface profile 122D have a greater curvature than the first upper inner surface profile 122A and the second upper inner surface profile 122B.

Also, the third lower inner surface profile 122C and the fourth lower inner surface profile 122D have distinct focal points from one another and distinct from the first and second lower inner surface profiles 122A and 122B. The third and fourth lower inner surface profiles 122B and 122D also have a greater curvature than upper inner surface profiles 126C and 126D. The third lower inner surface profile 122C has a focal point 123C that is more proximal the lower inner surface profile 123C than the central axis 111 and more proximal than the LED light output axis 104A. The fourth lower inner surface profile 122D has a focal point 123D that is more proximal the lower inner surface profile 122D than the central axis 111 and more proximal than the LED light output axis 104C.

The convex surface 142 of the interior reflector 140 defines a third convex profile 142C at the third angular position relative to the central axis 111 and a fourth convex profile 142D at the fourth angular position. The third convex profile 142C and the fourth convex profile 142D share a common curvature and are non-distinct from one another. The third convex profile 142C and the fourth convex profile 142D also share a common focal point 143B that is located along the central axis 111. Ray traces of exemplary light rays A1, A2, and A3 that emanate from LED chip 103A and light rays C3, C4, and C5 that emanate from LED chip 103C are also shown in FIG. 3. Light rays A1 and C3 are directly impingent on upper inner surface profile 126C at approximately the same point on upper inner surface profile 126C. Upper inner surface profile 126C reflects light rays A1 and C3 such that light ray A1 is reflected more exteriorly than light ray C3. Light rays A2 and C4 are directly impingent of convex surface profile 142B at approximately the same point and are reflected outwardly toward upper inner surface profile 126C. The light rays A2 and C4 are then reflected by upper inner surface profile 126C such that light ray C4 is reflected more exteriorly than light ray A2. Light rays A3 and C5 are directly impingent on lower inner surface profile 122C at approximately the same point on lower inner surface profile 122C. Lower inner surface profile 122C reflects light rays A3 and C5 such that light ray A3 is reflected more exteriorly than light ray C5.

In some embodiments, the defocused optic 110 may be designed such that the luminous flux of the light emanating from the multichip LED 101 that is directly incident on convex surface 142 is substantially equal to the luminous flux of the light emanating from the multichip LED 101 that is directly incident on the lower inner surface 122 and the upper inner surface 126 of the outer reflector. Accordingly, approximately half of the light (in terms of luminous flux) from the multichip LED 101 will be "reversed" by the convex surface 142, thereby providing good mixing of the light from the multichip LED 101. One or more surface profiles of the convex surface 142, the upper surface 126, and/or the lower surface 122 may be designed such that approximately half the luminous flux in that section is directly incident on the lower inner surface 122 and the upper inner surface 126 and the other half is directly incident on the convex surface 142.

As generally illustrated in FIG. 1, the upper inner surface profiles 126A and 126B each extend about the central axis 111 approximately forty-five degrees, thereby creating two surface profile sections. The section line 2-2 of FIG. 1 is taken approximately midway along the section corresponding to the inner surface profile 126A and approximately midway along the section corresponding to the inner surface profile 126B. In other words, the sections corresponding to the inner surface profiles 126A and 126B each extend approximately twenty-two and a half degrees on each side of the section line 2-2. The lower surface profiles 122A and 122B likewise each extend about the central axis 111 approximately forty-five degrees. The section line 2-2 of FIG. 1 is also taken approximately midway along the section corresponding to the inner surface profile 122A and approximately midway along the section corresponding to the inner surface profile 122B, meaning those sections are substantially aligned with sections corresponding to respective of inner surface profiles 126A and 126B.

With continuing reference to FIG. 1, the upper inner surface profiles 126B and 126C also each extend about the central axis 111 approximately forty-five degrees, thereby creating two surface profile sections. One side of the section corresponding to the upper inner surface profile 126A abuts a section corresponding to the inner surface profile 126C. Likewise, one side of the section corresponding to the upper inner surface profile 126B abuts a section corresponding to the inner surface profile 126D. The section line 3-3 of FIG. 1 is taken approximately midway along the section corresponding to the inner surface profile 126C and approximately midway along the section corresponding to the inner surface profile 126D. The lower surface profiles 122C and 122D likewise each extend about the central axis 111 approximately forty-five degrees. The section line 3-3 of FIG. 1 is also taken approximately midway along the section corresponding to the inner surface profile 122C and approximately midway along the section corresponding to the inner surface profile 122D, meaning those sections are substantially aligned with sections corresponding to respective of inner surface profiles 126C and 126D.

The convex surface profile sections 142A, 142B, 142C, and 142D also each extend about the central axis 111 approximately forty-five degrees, thereby creating four surface profile sections. One side of the section corresponding to the convex surface profile 142A abuts a section corresponding to the convex surface profile 142C. Likewise, one side of the section corresponding to the convex surface profile 142B abuts a section corresponding to the convex surface profile 142D. The section line 2-2 of FIG. 1 is taken approximately midway along the section corresponding to the convex surface profile 142A and approximately midway along the section corresponding to the convex surface profile 142B. The section line 3-3 of FIG. 1 is taken approximately midway along the section corresponding to the convex surface profile 142C and approximately midway along the section corresponding to the convex surface profile 142D.

In the embodiment shown and discussed in connection with FIG. 1, the defocused optic 110 also contains four additional upper surface profile sections, four additional corresponding and aligned additional lower surface profile sections, and four additional corresponding and aligned convex surface profile sections. The additional sections may each be of approximately forty-five degrees. In some embodiments alternating upper surface profile sections may share a common profile. In other words, where eight total upper surface profile sections are present, each upper surface profile section is going to be flanked by two upper surface profile sections that share a common profile that is distinct from the section which they flank. Likewise, in some embodiments alternating lower profile sections and/or convex surface profile sections may share a common profile. In some embodiments the light output from the defocused reflector may be maintained within a five degree to twenty degree beam angle. In some versions of those embodiments the light output from the defocused reflector may be maintained at less than or equal to a twenty degree beam angle.

Specific profile, profile section, profile section arrangement, and other design parameters have been described in detail with respect to the defocused reflector 100. However, in other embodiments one or more aspects of the design parameters may be altered in order to achieve a desired light output and/or to interface with a given multi-chip LED. For example, in alternative embodiments one or more profile sections may extend more or less than forty-five degrees about a central axis. Also, for example, in alternative embodiments one or more sections may extend more or less degrees about a central axis than one or more other sections. Also, for example, in alternative embodiments there may be a greater number of lower profile sections provided than upper profile sections. Also, for example, in alternative embodiments, the interior reflector 140 may have a common convex surface profile at every angular position relative to the central axis 111. Also, although distinct transitions between profile sections are depicted in FIG. 1, it is also contemplated that the profiles may gradually change. For example, in some embodiments upper inner surface profile 126A may be provided at a first angular position and upper inner surface profile 126C may be provided at a second angular position offset approximately twenty degrees from the upper inner surface profile 126A. One or more distinct profiles may be provided between the first angular position and the second angular position as the upper inner surface profile 126A is gradually transitioned to the upper inner surface profile 126C.

Figure 4:
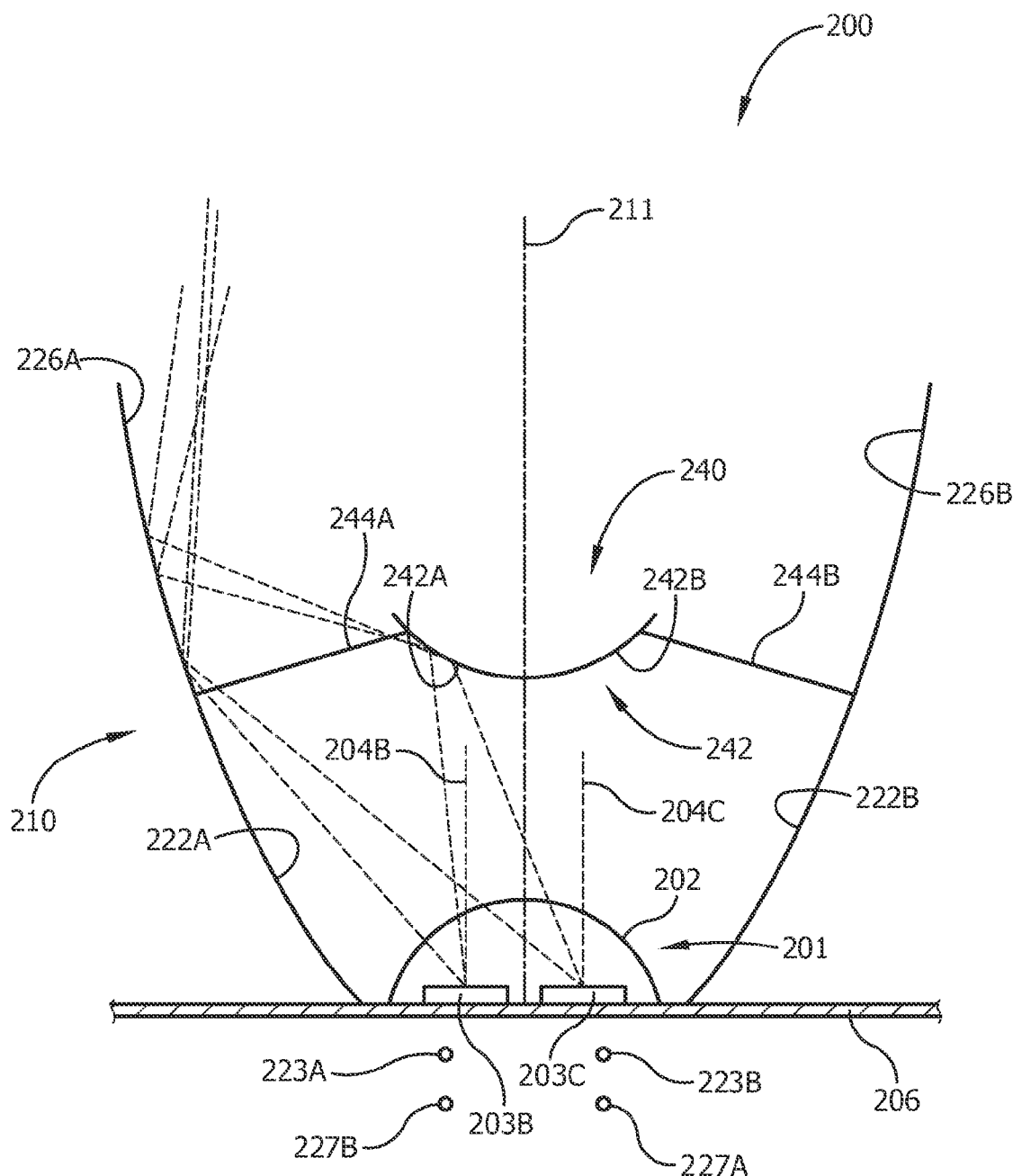
FIG. 4 illustrates a section view of a second embodiment of a LED-based lighting unit having a second embodiment of a defocused optic.

With reference now to FIG. 4, a second embodiment of a LED-based lighting unit 200 having a second embodiment of a defocused optic 210 is illustrated in schematic format. Two individual LED chips 203B and 203C of a multichip LED 201 are shown surrounded by an LED dome 202. The LED chips 203A and 203B are mounted on a mounting base 206 and each have a respective light output axis 204A and 204B. The defocused optic 210 is affixed in position about the multichip LED 201. A single level outer reflector has an inner surface 224 having a first inner surface profile 224A at a first angular position relative to a central axis 211 of the defocused optic 210. The inner surface 224 also defines a second inner surface profile 224B at a second angular position relative to a central axis 211 of the defocused optic 210. The first inner surface profile 224A and the second inner surface profile 224B share a common curvature and are non-distinct from one another. However, the first inner surface profile 224A and the second inner surface profile 224B do have distinct respective focal points 225A and 225B.

An interior reflector 240 is surrounded by the inner surface 224 and has a convex surface 242 facing the multichip LED 201 and intersecting the central axis of LED chips 203B and 203C. The convex surface 242 defines a first convex surface profile 242A at the first angular position and a second convex surface profile 242B at the second angular position. The first and second profiles 242A and 242B share a common curvature and are non-distinct from one another and also share a common focal point 243. Although not depicted, at one or more angular orientations relative to the central axis 211, the inner surface 224 has a profile that is distinct from inner surface profile 224A and 224B. Convex surface 242 may also optionally have a profile that is distinct form first and second convex surface profiles 242A and 242B at one or more angular orientations relative to the central axis 211.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited. Also, any reference numerals or other characters, appearing between parentheses in the claims, are provided merely for convenience and are not intended to limit the claims in any way, In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A defocused optic for mixing light output from a multi-chip LED, comprising:
    an interior reflector having a central axis; and
    an outer reflector surrounding said interior reflector and said central axis,
    said outer reflector having a concave inner surface provided about said central axis, said concave inner surface redirecting a majority of said light output impingent thereon toward an illumination area,
    wherein said concave inner surface defines a first concave surface profile at a first angular position relative to said central axis and a second concave surface profile at a second angular position relative to said central axis, wherein said first concave surface profile is distinct from said second concave surface profile such that the curvature of said concave inner surface at said first angular position is different from the curvature of said concave inner surface at said second angular position,
    said interior reflector having a convex surface facing said multi-chip LED, said convex surface redirecting a majority of said light output impingent thereon toward said outer reflector, and
    wherein said convex surface defines a first convex profile at said first angular position and a second convex profile at said second angular position, said first convex profile distinct from said second convex profile.

2. The defocused optic of claim 1, wherein said outer reflector includes a concave second inner surface provided about said central axis, said second inner surface positioned more distal said multi-chip LED than said inner surface.

3. The defocused optic of claim 2, wherein said second inner surface defines a third concave surface profile at said first angular position and a fourth concave surface profile at said second angular position, said third concave surface profile distinct from said first concave surface profile and said fourth concave surface profile distinct from said second concave surface profile.

4. The defocused optic of claim 1, wherein said concave inner surface defines a third concave surface profile at a third angular position relative to said central axis, said third concave surface profile distinct from said first concave surface profile and said second concave surface profile.

5. The defocused optic of claim 4, wherein said concave inner surface has said second concave surface profile at a third angular position relative to said central axis and wherein said second angular position is interposed between said first angular position and said third angular position.

6. The defocused optic of claim 5, wherein said third angular position is offset approximately one-hundred and eighty degrees from said first angular position.

7. A LED-based lighting unit, comprising:
    at least one multi-chip LED comprising a plurality of LED chips, each of said LED chips emitting a LED light output having a main LED light output axis; and
    a defocused optic, said defocused optic having a central axis and comprising an outer reflector and an interior reflector, said outer reflector surrounding said interior reflector and said multi-chip LED, said outer reflector having a concave inner surface provided about said central axis, said concave inner surface redirecting a majority of said light output impingent thereon toward an illumination area,
    wherein said concave inner surface defines a first concave surface profile at a first angular position relative to said central axis and a second concave surface profile at a second angular position relative to said central axis, wherein said first concave surface profile is distinct from said second concave surface profile such that the curvature of said concave inner surface at said first angular position is different from the curvature of said concave inner surface at said second angular position,
    said interior reflector having a convex surface facing said multi-chip LED, said convex surface redirecting a majority of said light output impingent thereon toward said outer reflector, and
    wherein said convex surface intersects each said light output axis and defines a first convex profile at said first angular position and a second convex profile at said second angular position, said first convex profile distinct from said second convex profile.

8. The LED-based lighting unit of claim 7, wherein at least eighty percent of said light output redirected toward said illumination area is redirected within a fifteen degree beam angle.

9. The LED-based lighting unit of claim 7, wherein said concave inner surface has a first focal point at said first angular position, said first focal point located between a base of said concave inner surface at said first angular position and said LED light output axis most proximal said base of said concave inner surface at said first angular position.

10. The LED-based lighting unit of claim 9, wherein said concave inner surface has a second focal point at said second angular position, said second focal point located between said base of said concave inner surface at said second angular position and said LED light output axis most proximal said base of said concave inner surface at said second angular position.

11. The LED-based lighting unit of claim 7, wherein said outer reflector includes a concave second inner surface provided about said central axis, said second inner surface positioned more distal said multi-chip LED than said inner surface.

12. The LED-based lighting unit of claim 11, wherein said second concave inner surface defines a third concave surface profile at said first angular position and a fourth concave surface profile at said second angular position, said third concave surface profile distinct from said first concave surface profile and said fourth concave surface profile distinct from said second concave surface profile.

13. The LED-based lighting unit of claim 7, wherein said concave inner surface defines a third concave surface profile at a third angular position relative to said central axis, said third concave surface profile distinct from said first concave surface profile and said second concave surface profile.

14. A defocused optic for mixing light output from a multi-chip LED, comprising:
  an interior reflector having a central axis;
  a bi-level outer reflector surrounding said interior reflector and said central axis; said outer reflector having a lower concave inner surface provided about said central axis and an upper concave inner surface provided about said central axis more radially than said lower concave inner surface, said lower concave inner surface and said upper concave inner surface each redirecting a majority of said light output impingent thereon toward an illumination area;
  said lower concave inner surface comprising a plurality of lower concave inner surface sections, each of said lower concave inner surface sections having a lower focal point that is distinct from at least one neighboring of said lower concave inner surface sections;
  said upper concave inner surface comprising a plurality of upper concave inner surface sections, each of said upper concave inner surface sections having an upper focal point that is distinct from at least one neighboring of said upper concave inner surface sections and distinct from at least one neighboring of said lower concave inner surface sections;
  said interior reflector having a convex surface facing said multi-chip LED, said convex surface redirecting a majority of said light output impingent thereon outwardly toward said outer reflector.

15. The defocused optic of claim 14, wherein said convex surface comprises a plurality of convex surface sections, each of said convex surface sections having a convex focal point that is distinct from at least one neighboring of said convex surface sections.

16. The defocused optic of claim 14, wherein each said lower concave inner surface section extends at least fifteen degrees about said central axis.

17. The defocused optic of claim 14, wherein each said lower concave inner surface section is substantially angularly aligned with a corresponding upper concave inner surface section.

18. The defocused optic of claim 14, wherein said upper focal point of each said upper section is located more distal thereto than said central axis.

19. The defocused optic of claim 18, wherein said lower focal point of each said lower section is located more proximal thereto than said central axis.

20. The defocused optic of claim 14, wherein at least four upper concave inner surface sections are provided and at least four lower concave inner surface sections are provided.

* * * * *